(12) United States Patent
He et al.

(10) Patent No.: US 11,929,725 B2
(45) Date of Patent: Mar. 12, 2024

(54) BANDPASS FILTER CIRCUIT AND MULTIPLEXER

(71) Applicant: ANHUI ANUKI TECHNOLOGIES CO., LTD., Anhui (CN)

(72) Inventors: Chenggong He, Anhui (CN); Xiaodong Wang, Anhui (CN); Chengjie Zuo, Anhui (CN); Jun He, Anhui (CN)

(73) Assignee: ANHUI ANUKI TECHNOLOGIES CO., LTD., Anhui (CN)

( * ) Notice: Subject to any disclaimer, the term of this patent is extended or adjusted under 35 U.S.C. 154(b) by 394 days.

(21) Appl. No.: 17/296,437

(22) PCT Filed: Oct. 10, 2020

(86) PCT No.: PCT/CN2020/120190
§ 371 (c)(1),
(2) Date: May 24, 2021

(87) PCT Pub. No.: WO2021/227347
PCT Pub. Date: Nov. 18, 2021

(65) Prior Publication Data
US 2022/0263485 A1    Aug. 18, 2022

(30) Foreign Application Priority Data

May 12, 2020 (CN) .......................... 202010397806.4
May 12, 2020 (CN) .......................... 202020792089.0

(51) Int. Cl.
*H03H 7/01* (2006.01)
*H03H 7/46* (2006.01)
*H03H 9/54* (2006.01)

(52) U.S. Cl.
CPC ............ *H03H 7/0161* (2013.01); *H03H 7/46* (2013.01); *H03H 9/542* (2013.01)

(58) Field of Classification Search
CPC ........ H03H 7/0161; H03H 7/46; H03H 9/542; H03H 7/0115; H03H 9/605; H03H 9/6483; H03H 9/72; H03H 9/64
See application file for complete search history.

(56) References Cited

U.S. PATENT DOCUMENTS 9,124,242 B2 * 9/2015 Ueda ...................... H03H 9/725
11,329,626 B2 * 5/2022 Jachowski ............. H03H 9/542
(Continued)

FOREIGN PATENT DOCUMENTS

| CN | 107342749 | 11/2017 |
|---|---|---|
| CN | 210201796 | 3/2020 |

(Continued)

OTHER PUBLICATIONS

International Search Report, PCT/CN2020/120190, dated Feb. 10, 2021.

*Primary Examiner* — John W Poos
(74) *Attorney, Agent, or Firm* — Greenberg Traurig

(57) ABSTRACT

Provided by a bandpass filter circuit and a multiplexer. The bandpass filter circuit includes at least one electromagnetic LC filter circuit and at least one acoustic wave resonance unit. The at least one acoustic wave resonance unit includes an input port, an output port, at least one circuit element and at least three resonators. The at least one electromagnetic LC filter circuit is electrically connected to the at least one acoustic wave resonance unit, and the at least three resonators include at least one first resonator and at least one second resonator. In a case where the at least one first resonator includes one first resonator, the first resonator is connected in series between the input port and the output port.

4 Claims, 4 Drawing Sheets

(56) References Cited

U.S. PATENT DOCUMENTS

| | | | |
|---|---|---|---|
| 2012/0119847 A1* | 5/2012 | Iwaki | H03H 9/725 |
| | | | 333/133 |
| 2018/0123547 A1* | 5/2018 | Kato | H03H 7/01 |
| 2019/0028085 A1* | 1/2019 | Kato | H03F 3/72 |
| 2020/0028479 A1 | 1/2020 | Ta et al. | |
| 2020/0067490 A1 | 2/2020 | Kuwahara | |
| 2020/0153413 A1 | 5/2020 | Mori | |

FOREIGN PATENT DOCUMENTS

| | | |
|---|---|---|
| CN | 111490749 | 8/2020 |
| JP | 2003283363 | 10/2003 |
| WO | 2010116776 | 10/2010 |

* cited by examiner

BANDPASS FILTER CIRCUIT AND MULTIPLEXER

CROSS-REFERENCE TO RELATED APPLICATIONS

The present application is a National Phase Application under 35 U.S.C. 371 of International Patent Application No. PCT/CN2020/120190, filed on Oct. 10, 2020, which claims priority to Chinese patent application No. 202010397806.4 and application No. 202020792089.0, both filed on May 12, 2020, the disclosures of which are incorporated herein by reference in their entireties.

TECHNICAL FIELD

The present disclosure relates to the field of filter technologies, for example, to a bandpass filter circuit and a multiplexer.

BACKGROUND

A filter circuit is widely used in an integrated circuit, for example, in a multiplexer in the integrated circuit. In the modern communication, the demand for the filter circuit with a wide passband and a high suppression is increasing. However, although in the electromagnetic LC filter, the duplexer and the multiplexer in the existing art, a low insertion loss can be achieved in a relatively wide passband, it is difficult to achieve a sharp roll-off and strong wide adjacent band suppression. The suppression characteristic of adjacent bands can be enhanced only by increasing the number of stages of the filter circuit, which increases the volume of the device and increases the insertion loss.

SUMMARY

The present disclosure provides a bandpass filter circuit and a multiplexer to improve the roll-off slope of the bandpass filter circuit, enhance the suppression characteristic of adjacent bands, and filter the interference signals.

The present disclosure provides a bandpass filter circuit, and the bandpass filter circuit includes at least one electromagnetic LC filter circuit and at least one acoustic wave resonance unit.

The at least one acoustic wave resonance unit comprises an input port, an output port, at least one circuit element and at least three resonators. The at least one electromagnetic LC filter circuit is electrically connected to the at least one acoustic wave resonance unit, and the at least three resonators include at least one first resonator and at least one second resonator. In a case where the at least one first resonator comprises one first resonator, the one first resonator is connected in series between the input port and the output port, and in a case where the at least one first resonator comprises a plurality of first resonators, the plurality of first resonators connected in series are connected in series between the input port and the output port. Each of the at least one second resonator is connected to a respective terminal of the at least one first resonator. The circuit element is connected between the input port and the output port. The at least one circuit element comprises an inductor structure or a capacitor structure.

The present disclosure also provides a multiplexer, where the multiplexer includes the bandpass filter circuit provided in any embodiment of the present disclosure.

DETAILED DESCRIPTION

Figure 1:
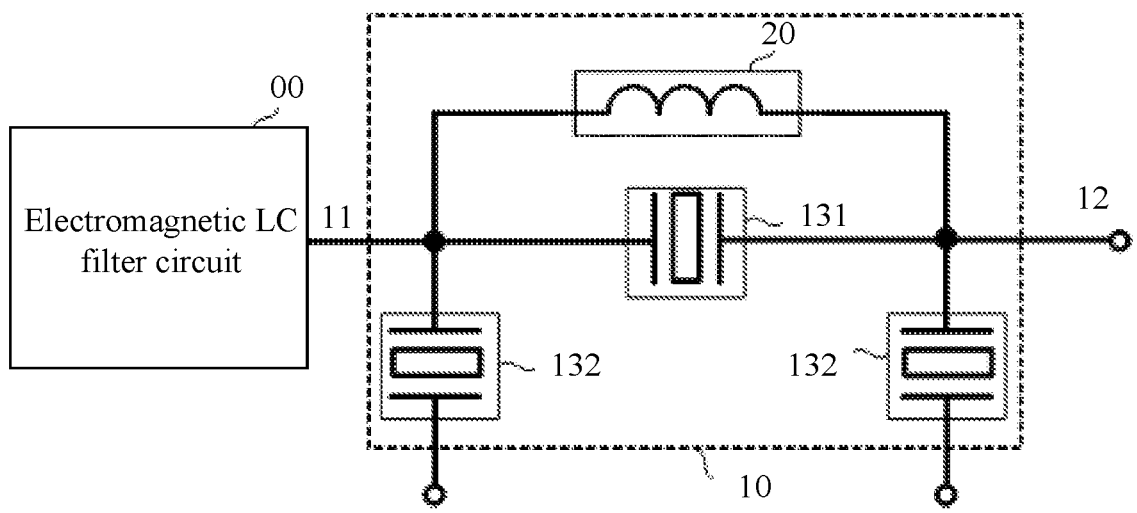
FIG. 1 is a structural diagram of a bandpass filter circuit provided by an embodiment of the present disclosure.

The present disclosure will be described below in conjunction with drawings and embodiments. The embodiments described below are intended to explain but not to limit the present disclosure. In addition, for ease of description, only part, not all, of structures related to the present disclosure are illustrated in the drawings.

An embodiment of the present disclosure provides a bandpass filter circuit. FIG. 1 is a structure diagram of a bandpass filter circuit provided by an embodiment of the present disclosure. As shown in FIG. 1, the bandpass filter circuit includes at least one electromagnetic LC filter circuit 00 and at least one acoustic wave resonance unit 10. The at least one acoustic wave resonance unit 10 includes an input port 11, an output port 12, at least one circuit element 20 and at least three resonators. An output port of the at least one electromagnetic LC filter circuit 00 is electrically connected to the input port 11 of the at least one acoustic wave resonance unit 10, and the at least three resonators include at least one first resonator 131 and at least one second resonator 132. In a case where the at least one first resonator 131 includes one first resonator 131, the one first resonator 131 is connected in series between the input port 11 and the output port 12, and in a case where the at least one first resonator 131 includes multiple first resonators 131, the multiple first resonators 131 are connected in series between the input port 11 and the output port 12. Each of the at least one second resonator 132 is connected to one terminal of the at least one first resonator 131. The at least one circuit element 20 is connected between the input port 11 and the output port 12. The at least one circuit element includes an inductor structure or a capacitor structure.

The at least one electromagnetic LC filter circuit 00 may be a filter circuit including an inductor structure and a capacitor structure, and a corresponding passband of the at least one electromagnetic LC filter circuit 00 is achieved by a specified configuration of those inductor and capacitor structures. The at least one electromagnetic LC filter circuit 00 can achieve a wideband passband, and when an input signal passes through the at least one electromagnetic LC filter circuit 00, the at least one electromagnetic LC filter circuit 00 is able to filter the input signal. The input signal filtered by the at least one electromagnetic LC filter circuit 00 is transmitted to the at least one acoustic wave resonance unit 10. A resonator in the at least one acoustic wave resonance unit 10 has a high quality factor. In the case where the at least one acoustic wave resonance unit 10 includes at least three resonators, the at least one acoustic wave resonance unit 10 can have a better frequency selectivity, that is, the at least one acoustic wave resonance unit 10 has a large roll-off slope in the frequency transition region. That is, the transition speed between the passband and the stopband in the bandpass filter circuit is fast, and the transition efficiency is high. In this way, the bandpass filter circuit has the characteristics of both the wide passband and the steep roll-off slope, improving the filter effect of the bandpass filter circuit.

The at least one first resonator 131 is connected in series between the input port 11 and the output port 12. When the input signal of the bandpass filter circuit is input to the at least one acoustic wave resonance unit 10 after passing through the at least one electromagnetic LC filter circuit 00, this signal is input to the at least one first resonator 131 through the input port 11 of the at least one acoustic wave resonance unit 10, and the at least one first resonator 131 filters this signal according to the resonant frequency of the at least one first resonator 131. That is, in a case where a frequency of this signal is equal to or approximately equal to the resonant frequency of the at least one first resonator 131, this signal can be output to the output port 12 of the at least one acoustic wave resonance unit 10 through the at least one first resonator 131, and then output through the output port 12 of the bandpass filter circuit, thereby achieving a filtering effect. In addition, the at least one circuit element 20 is connected between the input port 11 and the output port 12, so that the at least one circuit element 20 is connected in parallel to at least one first resonator 131. The at least one circuit element 20 includes the inductor structure or the capacitor structure, and electrical parameters of a parallel structure of the at least one circuit element 20 and the at least one first resonator 131 may be adjusted, so that the passband frequency range of the bandpass filter circuit can be adjusted. At the same time, the electrical parameters of an overall structure of the at least one first resonator 131 and the at least one circuit element 20 can be adjusted so that the overall structure of the at least one first resonator 131 and the at least one circuit element 20 can form a transmission zero within an adjacent band frequency range, or optimize a position of the transmission zero of the acoustic wave resonance unit, so that the output amplitude of the noise signal in the adjacent band frequency range is reduced, and the adjacent band suppression effect of the bandpass filter circuit is improved. One terminal of the second resonator 132 is connected to one terminal of the first resonator 131, and the other terminal of the second resonator 132 may be connected to another circuit or ground terminal. The second resonator 132 is connected to one terminal of the first resonator 131, so that the resonant frequency of the second resonator 132 is outside the passband frequency range of the bandpass filter circuit, or the anti-resonant frequency of the second resonator 132 is within the passband frequency range of the bandpass filter circuit, thereby preventing the signal within the passband frequency range from being output from the second resonator 132 to another circuit or ground terminal, and reducing the signal loss of the bandpass filter circuit. At the same time, in a case where the resonant frequency of the second resonator 132 is outside the passband frequency range of the bandpass filter circuit, for example, the resonant frequency of the second resonator 132 may be within the adjacent band frequency range, the noise signal in the adjacent band frequency range may be output from the second resonator 132 to another circuit or ground terminal, thereby effectively suppressing the noise signal in the adjacent band frequency range in the bandpass filter circuit and improving the filtering effect of the bandpass filter circuit. The adjacent band may be a frequency band above or below the passband, a transition band between the adjacent band and the passband merely ranges from 0 MHz to tens of MHz, and a bandwidth of the adjacent band is a frequency range of above 10% of the passband center frequency.

When the other terminal of the second resonator 132 is connected to another circuit, such as the capacitor structure and/or the inductor structure, an overall anti-resonant frequency of the second resonator 132 and another circuit may be adjusted, so that an anti-resonant frequency of a branch where the second resonator 132 is located is within the passband frequency range of the bandpass filter circuit. It also can avoid outputting the signal in the passband frequency range from the second resonator 132 to another circuit or ground terminal, thereby reducing the loss of the bandpass filter circuit.

In addition, FIG. 1 merely exemplarily shows that the at least one electromagnetic LC filter circuit 00 is connected to the input port 11 of the at least one acoustic wave resonance unit 10. In other embodiments, the at least one electromagnetic LC filter circuit 00 may also be connected to the output port 12 of the at least one acoustic wave resonance unit 10. In this case, the bandpass filter circuit formed by the at least one electromagnetic LC filter circuit 00 and the at least one acoustic wave resonance unit 10 has the same filtering effect as the bandpass filter circuit shown in FIG. 1, which will not be repeated here.

In the solutions of the embodiment of the present disclosure, the bandpass filter circuit is provided to include at least one electromagnetic LC filter circuit and at least one acoustic wave resonance unit, and the acoustic wave resonance unit includes at least one circuit element and at least three resonators. Since the resonators have a high quality factor, the at least one acoustic wave resonance unit has a large roll-off slope in a frequency transition region, so that the bandpass filter circuit has the characteristics of both the wide passband and the steep roll-off slope, improving the filtering effect of the bandpass filter circuit. In addition, the at least one first resonator is connected in parallel to the at least one circuit element, and the at least one second resonator is connected to one terminal of the at least one first resonator, so that the at least one acoustic wave resonance unit can form a transmission zero out of the passband frequency range or optimize a position of a transmission zero of the at least one acoustic wave resonance unit. In this way, the noise signal out of the passband frequency range in the bandpass filter circuit can be effectively suppressed, improving the adjacent band suppression effect of the bandpass filter circuit and then improving the filtering effect of the bandpass filter circuit.

Exemplarily, referring to FIG. 1, the acoustic wave resonance unit 10 includes three resonators; the three resonators are connected in a shape of $\pi$; and the circuit element 20 is an inductor structure.

The bandpass filter circuit exemplarily includes one acoustic wave resonance unit 10. The acoustic wave resonance unit 10 is exemplarily shown to include three resonators and one circuit element 20. The three resonators include one first resonator 131 and two second resonators 132. The one first resonator 131 is connected in series between the input port 11 and the output port 12, one second resonator 132 is connected to one terminal of the first resonator 131, and the other second resonator 132 is connected to the other end of the first resonator 131, forming a connection structure in a shape of $\pi$. The circuit element 20 is connected between the input port 11 and the output port 12; and the circuit element 20 has the inductor structure. In this case, the acoustic wave resonance unit 10 filters an input signal by the one first resonator 131, and filters a noise signal in the input signal by the two second resonators 132, so that the filtering effect of the bandpass filter circuit can be improved. Furthermore, the inductor structure is connected in parallel to both terminals of the first resonator 131, so that the parallel resonant frequency of the parallel structure formed by the inductor structure and the first resonator 131 is located out of the passband frequency range of the bandpass filter circuit, the noise signal out of the passband frequency range of the bandpass filter circuit is suppressed, and the filtering effect of the bandpass filter circuit is improved. The two second resonators 132 may be in the same type or different types.

Optionally, the resonant frequency of the first resonator 131 is within the passband frequency range of the bandpass filter circuit, and the resonant frequency of each second resonator 132 is within the adjacent band frequency range of the bandpass filter circuit. The adjacent band frequency is lower than the passband frequency.

Figure 2:
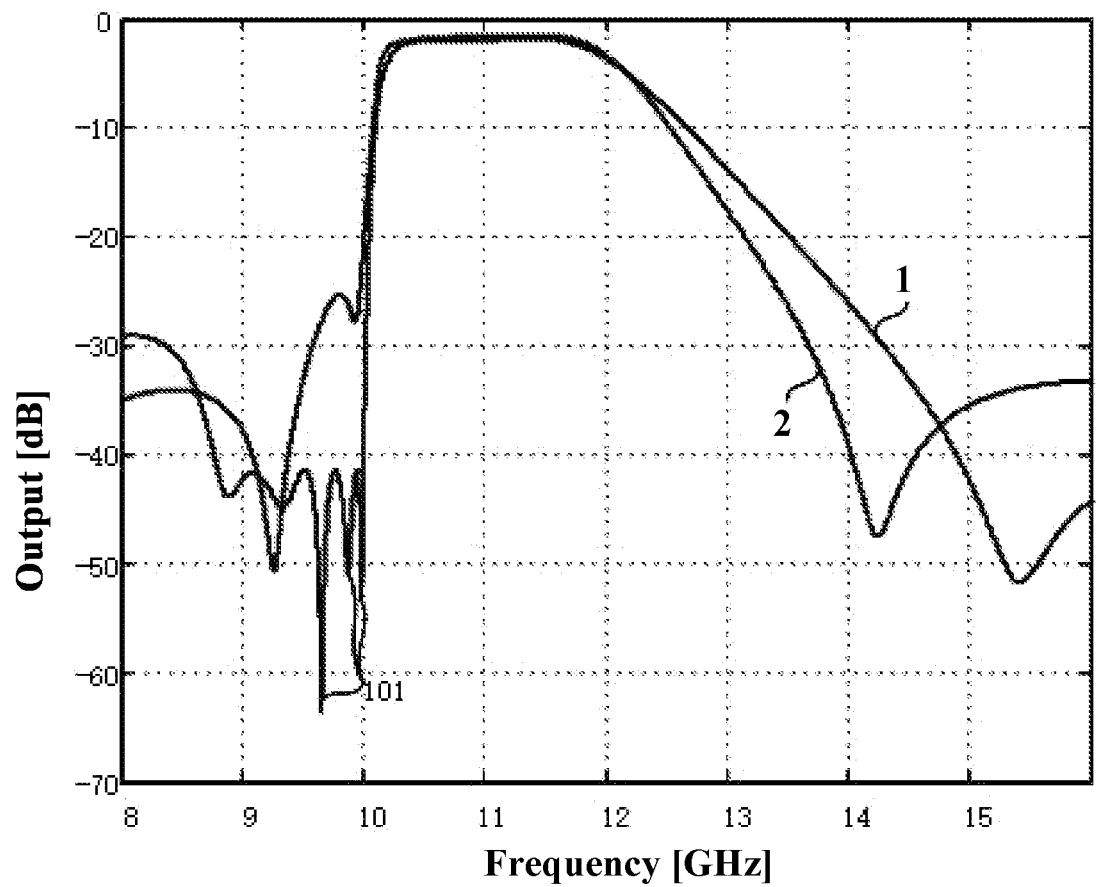
FIG. 2 is a schematic diagram of filtering corresponding to the bandpass filter circuit of FIG. 1.

In this case, the adjacent band may be a frequency band below the passband, a transition band between the adjacent band and the passband merely ranges from 0 MHz to tens of MHz, and a bandwidth of the adjacent band is a frequency range of above 10% of the passband center frequency. FIG. 2 is a schematic diagram of filtering corresponding to the bandpass filter circuit of FIG. 1. The abscissa represents a frequency and the ordinate represents an output amplitude. Curve 1 is a frequency-output curve of the electromagnetic LC filter circuit, and curve 2 is a frequency-output curve of the bandpass filter circuit of FIG. 1. As shown in FIG. 2, the passband frequency range of curve 2 is much larger than 200 MHz, and a roll-off slope in a frequency attenuation area of curve 2 is larger than a roll-off slope of a frequency attenuation area of curve 1. Therefore, it can be seen that the bandpass filter circuit in the present disclosure has the characteristics of both the wide passband and the steep roll-off slope, improving the filtering effect of the bandpass filter circuit. In addition, the resonant frequency of the first resonator 131 is within the passband frequency range of the bandpass filter circuit, so it can be ensured that a signal in the passband frequency range is output to the output port 12 through the first resonator 131. Furthermore, the inductor structure is connected in parallel to the first resonator 131 so that the inductor structure and the first resonator 131 can form a transmission zero 101 in the adjacent band frequency range, thereby reducing the output amplitude of the noise signal in the adjacent band frequency range, improving the adjacent band suppression effect of the bandpass filter circuit, and effectively improving the filtering effect of the bandpass filter circuit. In addition, in the case where the resonant frequency of the second resonator 132 is within the adjacent band frequency range of the bandpass filter circuit, a signal in the adjacent band frequency range can be output to another circuit or ground terminal through the second resonator 132, thereby reducing the output amplitude of the noise signal having a frequency within the adjacent band frequency range and improving the adjacent band suppression effect of the bandpass filter circuit. Further, the second resonator 132 blocks the signal having the frequency within the passband frequency range, thereby reducing the attenuation of the signal having the frequency within the passband frequency range and improving the filtering effect of the bandpass filter circuit. Meanwhile, the two second resonators 132 form two other transmission zeros 101 in the adjacent band frequency range, which further reduces the output amplitude of the noise signal having a frequency within the adjacent band frequency range and improves the adjacent band suppression effect of the bandpass filter circuit. Referring to FIG. 2, compared with curve 1, the adjacent band frequency of curve 2 is broadband, that is, a bandwidth suppressed by curve 2 on the adjacent band frequency is greater than 200 MHz, thus achieving the broadband suppression of the adjacent band and improving the filtering effect of the bandpass filter circuit.

Figure 3:
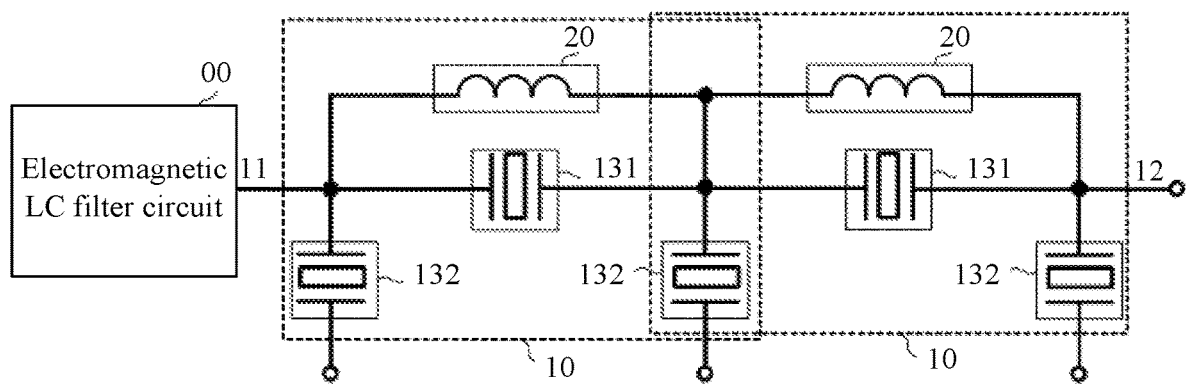
FIG. 3 is a structural diagram of another bandpass filter circuit provided by an embodiment of the present disclosure.

FIG. 3 is a structural diagram of another bandpass filter circuit provided by an embodiment of the present disclosure. As shown in FIG. 3, the bandpass filter circuit includes multiple acoustic wave resonance units 10. Adjacent acoustic wave resonance units 10 share one second resonator 132.

As shown in FIG. 3, FIG. 3 exemplarily shows that the bandpass filter circuit includes two acoustic wave resonance units 10. The two acoustic wave resonance units 10 share one second resonator 132. Multiple acoustic wave resonance units 10 are provided so that the input signal can be filtered by each acoustic wave resonance unit 10, and the filtering effect of the bandpass filter circuit is improved. In addition, each acoustic wave resonance unit 10 includes multiple transmission zeros within the adjacent band frequency range. In a case where multiple acoustic wave resonance units 10 are provided, the bandpass filter circuit has more transmission zeros within the adjacent band frequency range so that the output amplitude of the noise signal having a frequency within the adjacent band frequency range can be further reduced, and the adjacent band suppression effect of the bandpass filter circuit can be improved.

Figure 4:
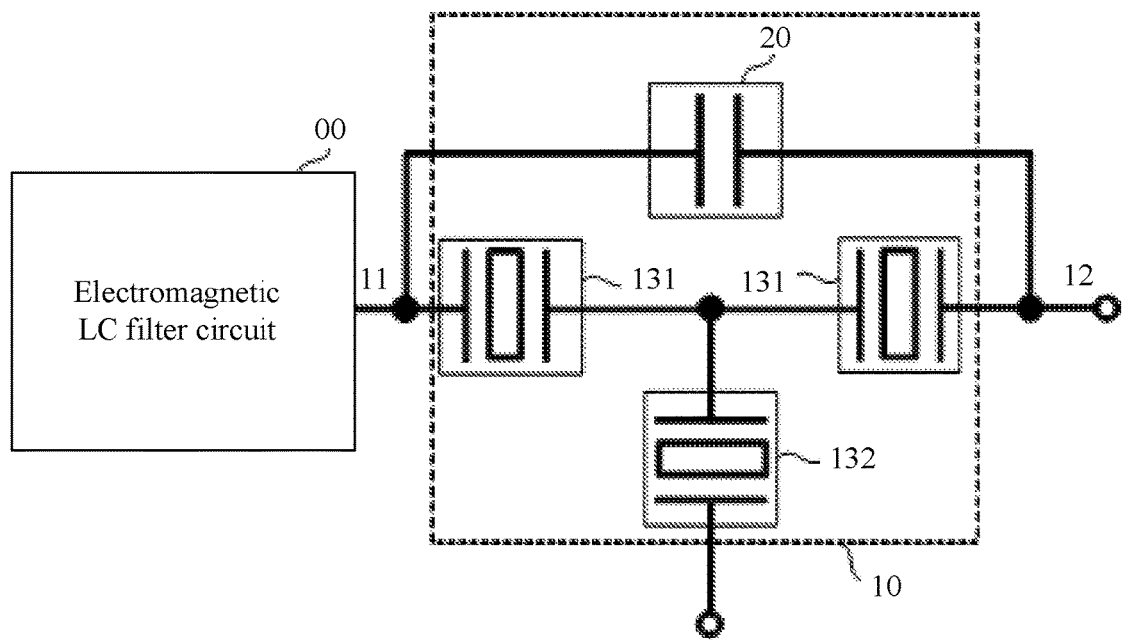
FIG. 4 is a structural diagram of another bandpass filter circuit provided by an embodiment of the present disclosure.

FIG. 4 is a structural diagram of another bandpass filter circuit provided by an embodiment of the present disclosure. As shown in FIG. 4, the acoustic wave resonance unit 10 includes three resonators. The three resonators are connected in a shape of T; and the circuit element 20 is a capacitor structure.

FIG. 4 exemplarily shows that the acoustic wave resonance unit 10 includes three resonators. The three resonators include two first resonators 131 and one second resonators 132. The two first resonators 131 are connected in series between the input port 11 and the output port 12, the one second resonator 132 is connected to a public terminal of the two first resonators 131, forming a connection structure in a shape of T. The capacitor structure is connected between the input port 11 and the output port 12, that is, is connected in parallel to the two first resonator 131, so that the parallel resonant frequency of the parallel structure formed by the capacitor structure and the first resonators 131 is located out of the passband frequency range of the bandpass filter circuit, the noise signal in the adjacent frequency range is suppressed, and the filtering effect of the bandpass filter circuit is improved. The two first resonators 131 may be in the same type or different types.

Optionally, the anti-resonant frequency of the first resonator 131 is within the adjacent band frequency range of the bandpass filter circuit, and the anti-resonant frequency of the second resonator 132 is within the passband frequency range of the bandpass filter circuit. The adjacent band frequency is higher than the passband frequency.

Figure 5:
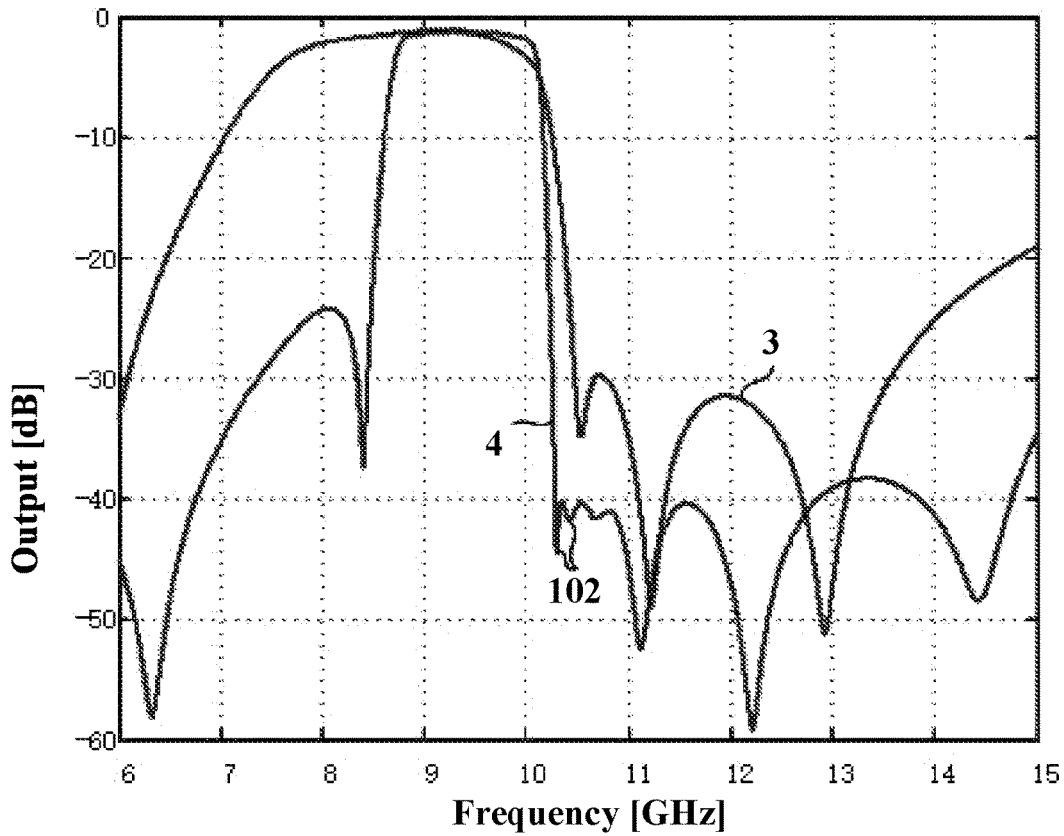
FIG. 5 is a schematic diagram of filtering corresponding to the bandpass filter circuit of FIG. 4.

In this case, the adjacent band may be a frequency band above the passband, a transition band between the adjacent band and the passband merely ranges from 0 MHz to tens of MHz, and a bandwidth of the adjacent band is a frequency range of above 10% of the passband center frequency. FIG. 5 is a schematic diagram of filtering corresponding to the bandpass filter circuit of FIG. 4. The abscissa represents a frequency and the ordinate represents an output amplitude.

Curve 3 is a frequency-output curve of the electromagnetic LC filter circuit, and curve 4 is a frequency-output curve of the bandpass filter circuit of FIG. 4. As shown in FIG. 5, the passband frequency range of curve 4 is much larger than 200 MHz, and a roll-off slope in a frequency attenuation area of curve 4 is larger than a roll-off slope of a frequency attenuation area of curve 3. Therefore, it can be seen that the bandpass filter circuit in the present disclosure has the characteristics of both the wide passband and the steep roll-off slope, improving the filtering effect of the bandpass filter circuit. In addition, the anti-resonant frequency of the first resonator 131 is within the adjacent band frequency range of the bandpass filter circuit so that the first resonator 131 blocks the noise signal having the frequency within the adjacent band frequency range, thereby reducing the output amplitude of the noise signal having the frequency within the adjacent band frequency range and then improving the filtering effect of the bandpass filter circuit. In addition, the anti-resonant frequency of the second resonator 132 is within the passband frequency range of the bandpass filter circuit so that the second resonator 132 blocks the signal having the frequency within the passband frequency range, thereby reducing the attenuation of the signal having the frequency within the passband frequency range and then improving the filtering effect of the bandpass filter circuit. Referring to FIG. 5, the acoustic wave resonance unit 10 in a T-shaped structure can form several transmission zeros 102 within the adjacent band frequency range, which reduces the output amplitude of the noise signal having the frequency within the adjacent band frequency range, improves the adjacent band suppression effect of the bandpass filter circuit, and effectively improves the filtering effect of the bandpass filter circuit. In addition, compared with curve 3, the adjacent band frequency of curve 4 is broadband, that is, a bandwidth suppressed by curve 4 on the adjacent band frequency is greater than 200 MHz, thus achieving the broadband suppression of the adjacent band and improving the filtering effect of the bandpass filter circuit.

Figure 6:
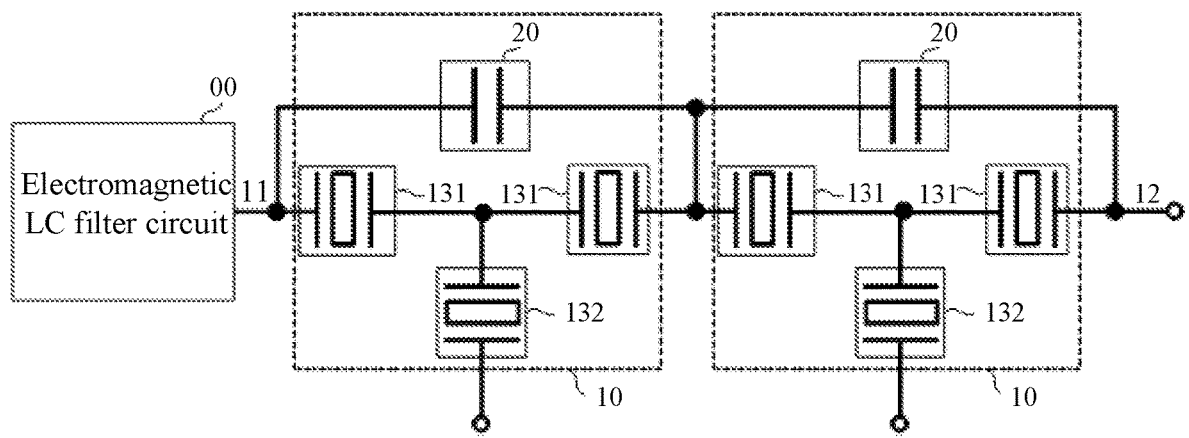
FIG. 6 is a structural diagram of another bandpass filter circuit provided by an embodiment of the present disclosure.

FIG. 6 is a structural diagram of another bandpass filter circuit provided by an embodiment of the present disclosure. Referring to FIG. 6, the bandpass filter circuit includes multiple acoustic wave resonance units 10. The multiple acoustic wave resonance units 10 are connected in series.

As shown in FIG. 6, FIG. 6 exemplarily shows that the bandpass filter circuit includes two acoustic wave resonance units 10. The two acoustic wave resonance units 10 are connected in series so that the input signal can be filtered by each acoustic wave resonance unit 10, and the filtering effect of the bandpass filter circuit is improved. In addition, each acoustic wave resonance unit 10 includes multiple transmission zeros within the adjacent band frequency range. In a case where multiple acoustic wave resonance units 10 are provided, the bandpass filter circuit has more transmission zeros within the adjacent band frequency range so that the output amplitude of the noise signal having the frequency within the adjacent band frequency range can be further reduced, and the adjacent band suppression effect of the bandpass filter circuit can be improved.

Figure 7:
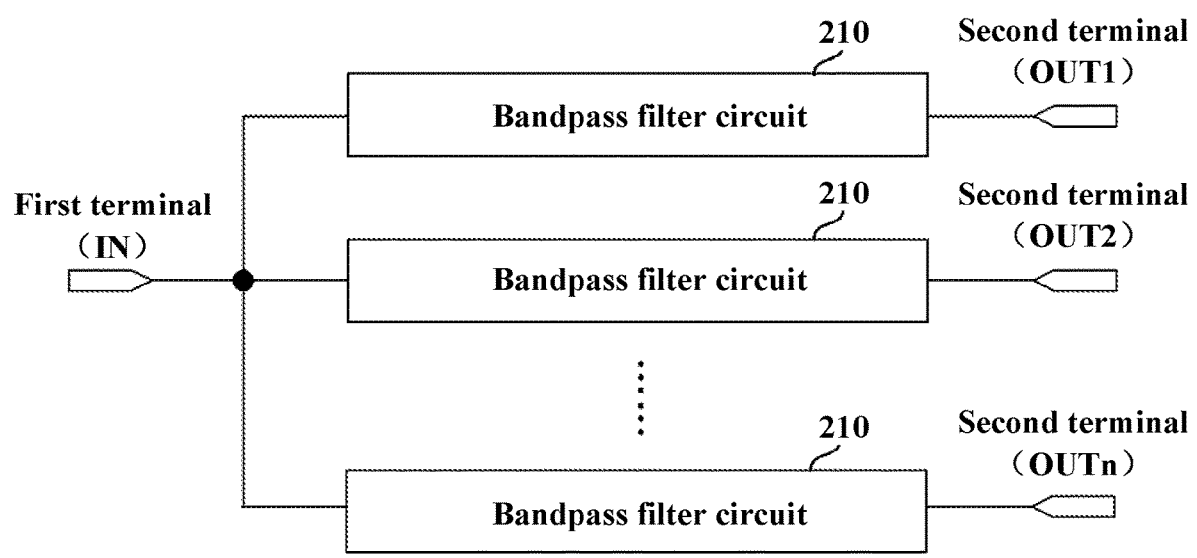
FIG. 7 is a structural diagram of a multiplexer provided by an embodiment of the present disclosure.

An embodiment of the present disclosure also provides a multiplexer. FIG. 7 is a structural diagram of a multiplexer provided by an embodiment of the present disclosure. As shown in FIG. 7, the multiplexer includes a bandpass filter circuit 210 provided in any embodiment of the present disclosure.

Referring to FIG. 7, the multiplexer includes one first terminal IN and at least two second terminals. Each bandpass filter circuit 210 is connected in series between the first terminal IN and any one of the second terminals of the multiplexer.

FIG. 7 exemplarily shows that the multiplexer includes one first terminal IN and n second terminals which are OUT1, OUT2, . . . , and OUTn respectively. Each bandpass filter circuit 210 is connected in series between the one first terminal IN and a respective one of the second terminals. For example, a first bandpass filter circuit 210 is connected in series between the first terminal IN and a first second terminal OUT1, a second bandpass filter circuit 210 is connected in series between the first terminal IN and a second second terminal OUT2, and so on. Since the multiplexer has the bandpass filter circuits 210 provided by any embodiment of the present disclosure, the multiplexer has the filtering effect of the bandpass filter circuit, that is, the multiplexer has a relatively high roll-off slope, and can achieve the steep transition band suppression while improving the adjacent band suppression effect of the bandpass filter circuit, thereby achieving broadband suppression of the adjacent band and then improving the filtering effect of the bandpass filter circuit.

The multiplexer may also include other filter circuits connected in series between the first terminal IN and any one of the second terminals. The other filter circuits may be a low-pass filter circuit, a high-pass filter circuit, or a bandpass filter circuit, which is not limited by the embodiments of the present disclosure.

What is claimed is:

1. A bandpass filter circuit, comprising at least one electromagnetic LC filter circuit and at least one acoustic wave resonance unit, wherein the at least one acoustic wave resonance unit comprises an input port, an output port, at least one circuit element and at least three resonators; the at least one electromagnetic LC filter circuit is electrically connected to the at least one acoustic wave resonance unit, and the at least three resonators include at least one first resonator and at least one second resonator; in a case where the at least one first resonator comprises one first resonator, the one first resonator is connected in series between the input port and the output port, and in a case where the at least one first resonator comprises a plurality of first resonators, the plurality of first resonators connected in series are connected in series between the input port and the output port; each of the at least one second resonator is connected to a respective terminal of the at least one first resonator; and the at least one circuit element is connected between the input port and the output port, wherein the circuit element comprises an inductor structure or a capacitor structure;

wherein the at least one acoustic wave resonance unit comprises three resonators; the three resonators are connected in a shape of $\pi$; and the circuit element is an inductor structure;

wherein a resonant frequency of the at least one first resonator is within a passband frequency range of the bandpass filter circuit, a resonant frequency of the at least one second resonator is within an adjacent band frequency range of the bandpass filter circuit, and a frequency within the adjacent band frequency range is lower than a frequency within the passband frequency range.

2. The bandpass filter circuit of claim 1, wherein the bandpass filter circuit comprises a plurality of acoustic wave resonance units; and adjacent ones of the plurality of acoustic wave resonance units share one of the at least one second resonator.

3. A multiplexer, comprising a bandpass filter circuit wherein the bandpass filter circuit comprises:
at least one electromagnetic LC filter circuit and at least one acoustic wave resonance unit,
wherein the at least one acoustic wave resonance unit comprises an input port, an output port, at least one circuit element and at least three resonators; the at least one electromagnetic LC filter circuit is electrically connected to the at least one acoustic wave resonance unit, and the at least three resonators include at least one first resonator and at least one second resonator; in a case where the at least one first resonator comprises one first resonator, the one first resonator is connected in series between the input port and the output port, and in a case where the at least one first resonator comprises a plurality of first resonators, the plurality of first resonators connected in series are connected in series between the input port and the output port; each of the at least one second resonator is connected to a respective terminal of the at least one first resonator; and the at least one circuit element is connected between the input port and the output port, wherein the circuit element comprises an inductor structure or a capacitor structure;
wherein the at least one acoustic wave resonance unit comprises three resonators; the three resonators are connected in a shape of $\pi$; and the circuit element is an inductor structure;
wherein a resonant frequency of the at least one first resonator is within a passband frequency range of the bandpass filter circuit, a resonant frequency of the at least one second resonator is within an adjacent band frequency range of the bandpass filter circuit, and a frequency within the adjacent band frequency range is lower than a frequency within the passband frequency range.

4. The multiplexer of claim 3, wherein the multiplexer further comprises one first terminal and at least two second terminals; and
the bandpass filter circuit is connected in series between the one first terminal and one of the at least two second terminals of the multiplexer.

* * * * *